(12) United States Patent
Ito

(10) Patent No.: US 11,785,752 B2
(45) Date of Patent: Oct. 10, 2023

(54) ELECTROMAGNETIC WAVE ABSORBING THERMALLY CONDUCTIVE COMPOSITION AND SHEET THEREOF

(71) Applicant: Fuji Polymer Industries Co., Ltd., Nagoya (JP)

(72) Inventor: Shingo Ito, Aichi (JP)

(73) Assignee: Fuji Polymer Industries Co., Ltd., Aichi (JP)

(*) Notice: Subject to any disclaimer, the term of this patent is extended or adjusted under 35 U.S.C. 154(b) by 486 days.

(21) Appl. No.: 17/263,062

(22) PCT Filed: Feb. 19, 2020

(86) PCT No.: PCT/JP2020/006577
§ 371 (c)(1),
(2) Date: Jan. 25, 2021

(87) PCT Pub. No.: WO2020/250493
PCT Pub. Date: Dec. 17, 2020

(65) Prior Publication Data
US 2022/0071070 A1 Mar. 3, 2022

(30) Foreign Application Priority Data
Jun. 10, 2019 (JP) .................. 2019-107705

(51) Int. Cl.
*H05K 9/00* (2006.01)
*H01Q 17/00* (2006.01)
(Continued)

(52) U.S. Cl.
CPC ............ *H05K 9/0083* (2013.01); *C08J 5/18* (2013.01); *C08K 3/08* (2013.01); *C08K 9/06* (2013.01);
(Continued)

(58) Field of Classification Search
CPC ....... H05K 9/0083; H05K 7/20; H01Q 17/004
See application file for complete search history.

(56) References Cited

U.S. PATENT DOCUMENTS 9,487,690 B2* 11/2016 Tanaka .................. C08K 7/00
9,929,475 B2*  3/2018 Lee ...................... H01Q 17/004
(Continued)

FOREIGN PATENT DOCUMENTS

CN          1926936      3/2007
CN          103959929    4/2014
(Continued)

OTHER PUBLICATIONS

Extended European Search Report issued in corresponding European Patent Application No. 20821711.7, dated Aug. 3, 2021, 11 pages.
(Continued)

*Primary Examiner* — Hung V Ngo
(74) *Attorney, Agent, or Firm* — Hamre, Schumann, Mueller & Larson, P.C.

(57) ABSTRACT

An electromagnetic wave absorbing thermally conductive composition contains a matrix resin component, metal soft magnetic particles, and thermally conductive particles. The metal soft magnetic particles are carbonyl iron particles and are present in an amount of 30% by volume or more when the electromagnetic wave absorbing thermally conductive composition is a population parameter. A value of an imaginary part ($\mu''$) of relative permeability of the electromagnetic wave absorbing thermally conductive composition is 0.9 or more in at least some bands in a frequency range of 18 to 26.5 GHz. The electromagnetic wave absorbing thermally conductive composition in the form of a sheet has a thermal conductivity of 2.0 W/m·K or more in the thickness direction. A sheet of the present invention incudes the above composition in the form of a sheet. Thus, the present (Continued)

invention provides the electromagnetic wave absorbing thermally conductive composition and its sheet that can increase the value of the imaginary part ($\mu''$) of relative permeability in a frequency band of 18 to 26.5 GHz, efficiently absorb electromagnetic wave noise in this frequency band, and also have a high thermal conductivity.

18 Claims, 1 Drawing Sheet

(51) Int. Cl.
| | |
|---|---|
| H05K 7/20 | (2006.01) |
| C09K 5/14 | (2006.01) |
| C08J 5/18 | (2006.01) |
| C08K 3/08 | (2006.01) |
| C08K 9/06 | (2006.01) |

(52) U.S. Cl.
CPC ............ *C09K 5/14* (2013.01); *H01Q 17/004* (2013.01); *H05K 7/20* (2013.01); *C08J 2383/04* (2013.01); *C08K 2201/001* (2013.01); *C08K 2201/005* (2013.01); *C08K 2201/01* (2013.01)

(56) References Cited

U.S. PATENT DOCUMENTS

| | | | | |
|---|---|---|---|---|
| 9,999,158 | B2* | 6/2018 | Misra | H05K 9/003 |
| 10,477,739 | B2* | 11/2019 | Dixon | H05K 1/0203 |
| 11,587,705 | B2* | 2/2023 | Fujita | C01G 49/00 |
| 2001/0051673 | A1 | 12/2001 | Suzuki et al. | |
| 2002/0077439 | A1* | 6/2002 | Sakurai | C08K 5/0091 |
| | | | | 528/10 |
| 2003/0008969 | A1* | 1/2003 | Takahashi | H01Q 17/004 |
| | | | | 524/588 |
| 2003/0044623 | A1 | 3/2003 | Sakurai et al. | |
| 2003/0219598 | A1* | 11/2003 | Sakurai | C09D 5/032 |
| | | | | 428/403 |
| 2004/0054029 | A1* | 3/2004 | Fujiki | H05K 9/0083 |
| | | | | 523/137 |
| 2007/0196671 | A1 | 8/2007 | Kobayashi | |
| 2008/0206544 | A1 | 8/2008 | Kim et al. | |
| 2010/0200796 | A1* | 8/2010 | Kato | H01L 23/552 |
| | | | | 252/62.51 R |
| 2016/0233173 | A1 | 8/2016 | Do et al. | |
| 2016/0234981 | A1 | 8/2016 | Do et al. | |
| 2019/0080978 | A1 | 3/2019 | Kumura et al. | |
| 2020/0022259 | A1* | 1/2020 | Mitsuya | C08K 3/38 |
| 2020/0022291 | A1* | 1/2020 | Matsuzaki | C08K 3/36 |

FOREIGN PATENT DOCUMENTS

| | | |
|---|---|---|
| EP | 3 254 541 | 12/2017 |
| JP | 2002-164689 | 6/2002 |
| JP | 2002-329995 | 11/2002 |
| JP | 2003-023287 | 1/2003 |
| JP | 2005-015679 | 1/2005 |
| JP | 2006-310812 | 11/2006 |
| JP | 4512919 | 5/2010 |
| JP | 4623244 | 2/2011 |
| JP | 2011-187671 | 9/2011 |
| JP | 2013-136766 | 7/2013 |
| JP | 2014-078698 | 5/2014 |
| JP | 2017-175080 | 9/2017 |
| JP | 2020-038913 | 3/2020 |

OTHER PUBLICATIONS

Hirayama, "Simultaneous Measurement of Complex Permittivity and Complex Permeability of Lossy Sheet", Journal of the Society of Instrument and Control Engineers, vol. 53, No. 3, 2014, pp. 233-238 with its Partial Translation.

Keysight Technologies, "Basics of Measuring Dielectric Constant of Materials" [PDF file] 2017, pp. 26-28. Retrieved from https://www.keysight.com/upload/cmc_upload/All/Dielectric_constant_20170614.pdf with its Partial Translation.

International Search Report issued in International Application No. PCT/JP2020/06577, dated May 12, 2020, 4 pages w/translation.

* cited by examiner

ELECTROMAGNETIC WAVE ABSORBING THERMALLY CONDUCTIVE COMPOSITION AND SHEET THEREOF

TECHNICAL FIELD

The present invention relates to an electromagnetic wave absorbing thermally conductive composition and its sheet that can efficiently absorb electromagnetic wave noise in a specific frequency domain.

BACKGROUND ART

Because of the high integration and high density of electronic components mounted on, e.g., personal computers and vehicles, the amount of heat generated per unit area of an electronic component has been increasing in recent years. Accordingly, there has been a growing demand for a high thermally conductive material that can achieve a higher thermal conductivity and release heat more quickly than a conventional heat dissipating material. Moreover, when the thermally conductive material is used for electrical insulation purposes, it is required to have high and stable electrical insulation properties even in a high operating temperature environment. On the other hand, the operating frequency of the CPU becomes significantly higher due to the need for high speed processing. Consequently, high-frequency components (electromagnetic wave noise) are generated, and this electromagnetic wave noise is carried by a signal through, e.g., a communication line and may have an adverse effect such as a malfunction. For this reason, heat generated from the CPU should be efficiently dissipated to the outside. Then, a method has been proposed that transfers the heat generated from the CPU efficiently to a metal heat sink by using, e.g., thermally conductive silicone grease or thermally conductive silicone rubber as a heat dissipating medium. However, since the thermally conductive silicone rubber or the like does not have an electromagnetic wave absorption effect (i.e., electromagnetic wave noise suppression effect), the above method cannot avoid problems such as a malfunction caused by electromagnetic wave noise.

Conventional technologies include the following. Patent Document 1 proposes an adhesive tape with a two-layer structure having a porous layer that contains a thermally conductive filler and a layer that contains an electromagnetic wave shielding filler or an electromagnetic wave absorbing filler. Patent Document 2 proposes that organopolysiloxane be mixed with an electromagnetic wave absorbing filler and a thermally conductive filler. Patent Document 3 proposes that an organic molecular sheet or a glass sheet be formed on a silicone gel layer in which a soft magnetic powder is dispersed.

PRIOR ART DOCUMENTS

Patent Documents

Patent Document 1: JP 2013-136766 A
Patent Document 2: JP 2005-015679 A
Patent Document 3: JP 2003-023287 A

DISCLOSURE OF INVENTION

Problem to be Solved by the Invention

However, in the conventional electromagnetic wave absorbing thermally conductive compositions, an imaginary part ($\mu''$) of relative permeability is low in a frequency band of 18 to 26.5 GHz.

To solve the above conventional problems, the present invention provides an electromagnetic wave absorbing thermally conductive composition and its sheet that can increase the value of the imaginary part ($\mu''$) of relative permeability in a frequency band of 18 to 26.5 GHz, efficiently absorb electromagnetic wave noise in this frequency band, and also have a high thermal conductivity.

Means for Solving Problem

An electromagnetic wave absorbing thermally conductive composition of the present invention contains a matrix resin component, metal soft magnetic particles, and thermally conductive particles. The metal soft magnetic particles are carbonyl iron particles and are present in an amount of 30% by volume or more when the electromagnetic wave absorbing thermally conductive composition is a population parameter. A value of an imaginary part ($\mu''$) of relative permeability of the electromagnetic wave absorbing thermally conductive composition is 0.9 or more in at least some bands in a frequency range of 18 to 26.5 GHz. The electromagnetic wave absorbing thermally conductive composition in the form of a sheet has a thermal conductivity of 2.0 W/m·K or more in a thickness direction.

An electromagnetic wave absorbing thermally conductive sheet of the present invention includes the electromagnetic wave absorbing thermally conductive composition in the form of a sheet. A value of an imaginary part ($\mu''$) of relative permeability of the electromagnetic wave absorbing thermally conductive sheet is 0.9 or more in at least some bands in a frequency range of 18 to 26.5 GHz. The electromagnetic wave absorbing thermally conductive sheet has a thermal conductivity of 2.0 W/m·K or more in a thickness direction.

Effects of the Invention

In the present invention, the electromagnetic wave absorbing thermally conductive composition contains the matrix resin component, the metal soft magnetic particles, and the thermally conductive particles. The metal soft magnetic particles are carbonyl iron particles. Thus, the present invention can provide the electromagnetic wave absorbing thermally conductive composition and its molded body that can increase the value of the imaginary part ($\mu''$) of relative permeability in a frequency band of 18 to 26.5 GHz, efficiently absorb electromagnetic wave noise in this frequency band, and also have a high thermal conductivity. There are many types of metal soft magnetic particles. In particular, the carbonyl iron particles are selected and used in combination with the thermally conductive particles, so that electromagnetic wave noise in the above frequency band can be efficiently absorbed, and heat generated by the absorption of electromagnetic wave noise can be rapidly transferred to the outside.

DESCRIPTION OF THE INVENTION

Figure 1A:
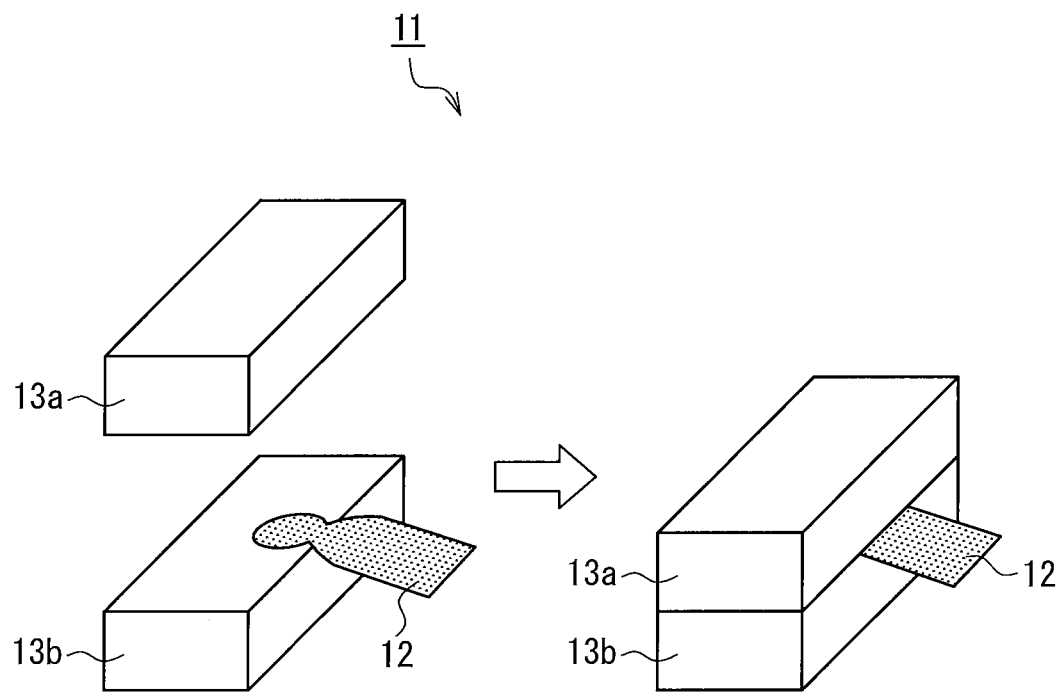
FIGS. 1A and 1B are diagrams illustrating a method for measuring a thermal conductivity used in an example of the present invention.

A complex permeability is expressed by $\mu'$ (real part) and $\mu''$ (imaginary part). The imaginary part ($\mu''$) of relative permeability represents a magnetic loss peak and is very important for the properties of an electromagnetic wave absorbing material. With recent improvements in performance of electronic devices (e.g., PC) and in communication speed of communication devices (e.g., wireless LAN), the frequency of electromagnetic wave noise emitted from these devices is increased. This raises concerns about electromagnetic wave noise at a frequency of GHz, particularly a frequency of about 20 GHz or more. Therefore, the electromagnetic wave absorbing material that can efficiently absorb electromagnetic wave noise in this frequency range has been required. Moreover, the absorbed electromagnetic wave is converted to heat. Thus, the electromagnetic wave absorbing material itself needs to have thermal conductive properties in order to release the heat efficiently. Under these circumstances, the present inventors conducted many studies and have completed the present invention.

In the present invention, the carbonyl iron particles are iron particles obtained by a carbonyl process (that uses the thermal decomposition of pentacarbonyl iron (iron carbonyl, $Fe(CO)_5$)). The average particle size of the carbonyl iron particles is preferably 0.1 to 100 μm, more preferably 1 to 20 μm, and further preferably 1 to 10 μm. The amount of the carbonyl iron particles added is preferably 30% by volume or more, and more preferably 34% by volume or more when the electromagnetic wave absorbing thermally conductive composition is a population parameter. The upper limit is preferably 63% by volume or less, and more preferably 60% by volume or less. The value of the imaginary part ($\mu''$) of relative permeability of the electromagnetic wave absorbing thermally conductive composition is 0.9 or more in at least some bands in a frequency range of 18 to 26.5 GHz. If the value is less than 0.9, the absorption of electromagnetic wave noise is not good. The electromagnetic wave absorbing thermally conductive composition in the form of a sheet has a thermal conductivity of 2.0 W/m·K or more. If the thermal conductivity is less than 2.0 W/m·K, it is not preferred.

The amount of the thermally conductive particles is preferably 100 parts by mass or more, and more preferably 200 parts by mass or more with respect to 100 parts by mass of the matrix resin component. The upper limit is preferably 800 parts by mass or less, and more preferably 700 parts by mass or less. The thermally conductive particles are present preferably in an amount of 7 to 45% by volume, and more preferably in an amount of 13 to 41% by volume when the electromagnetic wave absorbing thermally conductive composition is a population parameter. For example, when an aluminum oxide is used, the amount of the thermally conductive particles is 300 to 700 parts by mass, and preferably 350 to 660 parts by mass with respect to 100 parts by mass of the matrix resin component. The aluminum oxide is present preferably in an amount of 18 to 45% by volume, and more preferably in an amount of 21 to 41% by volume when the electromagnetic wave absorbing thermally conductive composition is a population parameter.

The thermally conductive particles are preferably thermally conductive inorganic particles composed of at least one selected from a metal oxide, a metal nitride, a metal carbide, a metal boride, and a metal simple substance. Examples of the thermally conductive inorganic particles include aluminum oxide, aluminum nitride, silicon nitride, magnesium oxide, silicon carbide, hexagonal boron nitride, graphite, graphene, and carbon black. These particles may be used individually or in combinations of two or more. The average particle size of the thermally conductive particles is preferably 0.1 to 100 μm. The average particle size may be measured with a laser diffraction scattering method to determine D50 (median diameter) in a volume-based cumulative particle size distribution. The method may use, e.g., a laser diffraction/scattering particle size distribution analyzer LA-950 S2 manufactured by HORIBA, Ltd.

The matrix resin component is preferably a thermosetting resin. Examples of the thermosetting resin include silicone resin, epoxy resin, phenol resin, unsaturated polyester resin, and melamine resin, but are not limited thereto. Among them, the silicone resin is preferred. The silicone resin has good properties such as high heat resistance and flexibility and is suitable for an electromagnetic wave absorbing thermally conductive sheet. The curing type of the silicone resin may be, e.g., an addition curable type, a peroxide curable type, or a condensation curable type. Any curing type may be used, and two or more curing types may also be used in combination.

The thermosetting resin is preferably a liquid silicone resin having a viscosity of 1.5 Pa·s or less at 25° C. before curing, which is measured by a V-type rotational viscometer (rotor No. 2, number of revolutions: 30 rpm). If the viscosity is more than 1.5 Pa·s, it is difficult for the resin to incorporate the necessary amount of metal soft magnetic particles and thermally conductive particles. Moreover, the composition obtained by incorporating these particles into the resin has a high viscosity, and thus the kneadability or formability of the composition will be significantly reduced.

It is preferable that at least one selected from the metal soft magnetic particles and the thermally conductive particles are surface treated with a silane compound, a titanate compound, an aluminate compound, or partial hydrolysates thereof. This can prevent the deactivation of a curing catalyst or a crosslinking agent and improve the storage stability. The silane compound is expressed by $R_aSi(OR')_{3-a}$, where R represents a substituted or unsubstituted organic group having 1 to 20 carbon atoms, R' represents an alkyl group having 1 to 4 carbon atoms, and a is 0 or 1. Examples of an alkoxysilane compound (simply referred to as "silane" in the following) expressed by $R_aSi(OR')_{3-a}$, where R represents a substituted or unsubstituted organic group having 1 to 20 carbon atoms, R' represents an alkyl group having 1 to 4 carbon atoms, and a is 0 or 1, include the following: methyltrimethoxysilane; ethyltrimethoxysilane; propyltrimethoxysilane; butyltrimethoxysilane; pentyltrimethoxysilane; hexyltrimethoxysilane; hexyltriethoxysilane; octyltrimethoxysilane; octyltriethoxysilane; decyltrimethoxysilane; decyltriethoxysilane; do decyltrimethoxysilane; dodecyltriethoxysilane; hexadecyltrimethoxysilane; hexadecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond.

The electromagnetic wave absorbing thermally conductive composition of the present invention is formed into a sheet. The value of the imaginary part ($\mu''$) of relative permeability of the sheet is 0.9 or more in at least some bands in a frequency range of 18 to 26.5 GHz. Preferably, the value of the imaginary part ($\mu''$) of relative permeability of the sheet is 0.9 or more in the entire band in the frequency range of 18 to 26.5 GHz. The thermal conductivity of the sheet is 2.0 W/m·K or more, and preferably 2.5 W/m·K or more in the thickness direction. The sheet-like molded body can easily be located between a heat dissipating member and an electronic component such as a semiconductor device that serves as both an electromagnetic wave source and a heat generating member.

The electromagnetic wave absorbing thermally conductive composition containing the matrix resin component, the metal soft magnetic particles, and the thermally conductive particles can be produced in the following manner. First, at least the above three components are mixed by a known mixing means. For example, a kneader or a stirrer may be used to mix the matrix resin with the metal soft magnetic particles and the thermally conductive particles. The matrix resin is generally composed of two or more components such as a base resin, a curing agent, and a curing accelerator. The order of mixing of these components does not matter when the matrix resin component is mixed with the metal soft magnetic particles and the thermally conductive particles. For example, first, the base resin, the curing agent, the curing accelerator, etc. may be mixed together at a predetermined ratio to prepare a matrix resin, and then the matrix resin may be mixed with each filler. Alternatively, the base resin and each filler may be mixed, to which, e.g., the curing agent and the curing accelerator may be added and further mixed.

The electromagnetic wave absorbing thermally conductive composition of the present invention is molded into a desired shape by, e.g., press molding, vacuum press molding, injection molding, extrusion molding, calender molding, or roll molding.

Figure 1B:
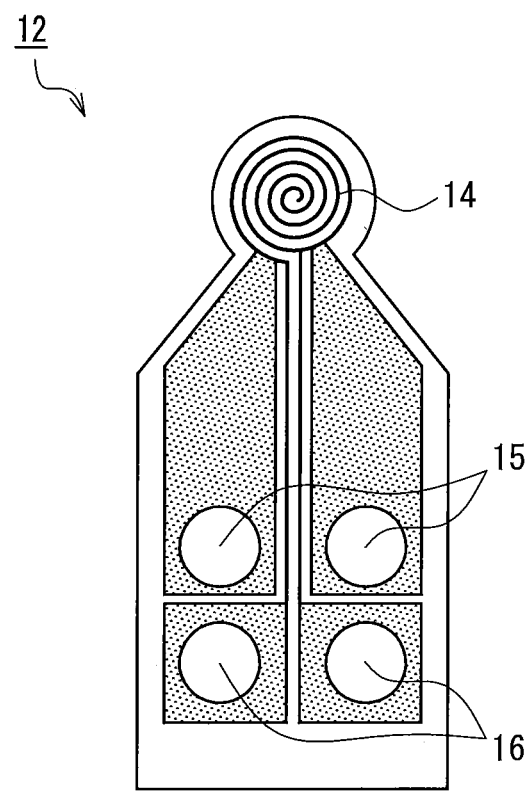

Hereinafter, the present invention will be described with reference to the drawings. In the following drawings, the same components are denoted by the same reference numerals. FIGS. 1A and 1B are diagrams illustrating a method for measuring a thermal conductivity used in an example of the present invention. As shown in FIG. 1A, using a thermal conductivity measuring apparatus 11, a polyimide film sensor 12 is sandwiched between two electromagnetic wave absorbing thermally conductive sheet samples 13a, 13b, and constant power is applied to the sensor 12 to generate a certain amount of heat. Then, the thermal characteristics are analyzed from a temperature rise value of the sensor 12. The sensor 12 has a tip 14 with a diameter of 7 mm. As shown in FIG. 1B, the tip 14 has electrodes with a double spiral structure. Moreover, an electrode 15 for an applied current and an electrode 16 for a resistance value (temperature measurement electrode) are located on the lower portion of the sensor 12.

EXAMPLES

Hereinafter, the present invention will be described in more detail by way of examples. However, the following examples only represent a part of the embodiment of the present invention. Thus, the present invention should not be interpreted as being limited to the examples.

<Thermal Conductivity>

The thermal conductivity of an electromagnetic wave absorbing thermally conductive sheet was measured by a hot disk (in accordance with ISO/CD 22007-2), as shown in FIGS. 1A and 1B. The thermal conductivity was calculated by the following formula 1.

$$\lambda = \frac{P_0 \cdot D(\tau)}{\pi^{3/2} \cdot r} \cdot \frac{D(\tau)}{\Delta T(\tau)} \quad \text{[Formula 1]}$$

λ: Thermal conductivity (W/m·K)
$P_0$: Constant power (W)
r: Radius of sensor (m)
τ: $\sqrt{\alpha \cdot t/r^2}$ α: Thermal diffusivity of sample (m²/s)
t: Measuring time (s)
D (τ): Dimensionless function of τ
ΔT (τ): Temperature rise of sensor (K)

<Electromagnetic Wave Absorption Properties>

The method for measuring the imaginary part (μ") of relative permeability is known from, e.g., Japanese Patent Publication No. 2011-187671 and Japanese Patent No. 4512919, which are incorporated herein by reference. The imaginary part (μ") of relative permeability was measured in the following manner. First, each of the sheets produced in Examples and Comparative Examples, as will be described later, was cut to a rectangle of 10.67 mm×4.32 mm and used as a sample. Then, the sample was inserted into a commercially available waveguide sample holder (with a thickness of 3 mm), and a reflection coefficient and a transmission coefficient were measured by using a vector network analyzer (E8361A manufactured by Agilent Technologies Japan, Ltd.). Based on the measured values, a complex permeability was calculated by the Nicolson-Ross-Weir method.

<Viscosity>

The viscosity of the silicone resin used was measured at 25° C. before curing by a V-type rotational viscometer (rotor No. 2, number of revolutions: 30 rpm).

Examples 1 to 5

First, 10.4 g of a commercially available liquid silicone resin A solution (containing a platinum-based catalyst) and 10.4 g of a commercially available liquid silicone resin B solution (containing a crosslinking agent) were mixed by a planetary centrifugal mixer to form a matrix resin. The matrix resin was mixed with carbonyl iron particles and an aluminum oxide, which had previously been surface treated with a silane compound, resulting in each composition as shown in Tables 1 and 2. Then, polyethylene terephthalate films were formed on both sides of the composition, and this composition was heated and press molded at 100° C. for 10 minutes. Thus, a sheet with a thickness of 1.5 mm was produced. Tables 1 and 2 show the physical properties of the resulting sheet.

Comparative Examples 1 to 6

First, 10.4 g of a commercially available liquid silicone resin A solution (containing a platinum-based catalyst) and 10.4 g of a commercially available liquid silicone resin B solution (containing a crosslinking agent) were mixed by a planetary centrifugal mixer to form a matrix resin. The matrix resin was mixed with any one of iron-based soft magnetic alloy particles, which had previously been surface treated with a silane compound, resulting in each composition as shown in Tables 2 and 3. Then, polyethylene terephthalate films were formed on both sides of the composition, and this composition was heated and press molded at 100° C. for 10 minutes. Thus, a sheet with a thickness of 1.5 mm was produced. Tables 2 and 3 show the physical properties of the resulting sheet.

TABLE 1

| Material | Explanation | Example 1 | Example 2 | Example 3 | Example 4 |
|---|---|---|---|---|---|
| | | Additive amount (phr), value in parentheses (Vol %) | | | |
| Liquid silicone resin I | viscosity 0.4 Pa·s | 100 | 100 | 100 | 100 |
| Liquid silicone resin II | viscosity 60 Pa·s | — | — | — | — |
| Aluminum oxide 62 μm | thermally conductive particles | 368 (23) | 368 (25) | 368 (25) | 368 (25) |
| Carbonyl iron particles 1.4 μm | metal soft magnetic particles | — | — | — | 1200 (42) |
| Carbonyl iron particles 4 μm | metal soft magnetic particles | 1450 (47) | 1200 (42) | — | — |
| Carbonyl iron particles 5.3 μm | metal soft magnetic particles | — | — | 1200 (42) | — |
| Imaginary part (μ") of relative permeability | at 18 GHz | 1.4 | 1.2 | 1.3 | 1.3 |
| | at 20 GHz | 1.3 | 1.4 | 1.1 | 1.2 |
| | at 26.5 GHz | 0.9 | 0.9 | 0.9 | 0.9 |
| Thermal conductivity (W/m·K) | | 2.5 | 2.4 | 2.7 | 2.1 |

(Note) The term phr is an abbreviation for "parts per hundred rubber" and indicates parts by weight of each compounding agent with respect to 100 parts by weight of rubber. The same is true in the following.

TABLE 2

| Material | Explanation | Example 5 | Comparative Example 1 | Comparative Example 2 | Comparative Example 3 |
|---|---|---|---|---|---|
| | | Additive amount (phr), value in parentheses (Vol %) | | | |
| Liquid silicone resin I | viscosity 0.4 Pa·s | 100 | — | — | — |
| Liquid silicone resin II | viscosity 60 Pa·s | — | 100 | 100 | 100 |
| Aluminum oxide 62 μm | thermally conductive particles | 368 (29) | — | — | — |
| Carbonyl iron particles 4 μm | metal soft magnetic particles | 840 (34) | 400 (34) | 250 (24) | — |
| Fe-Ni particles 10 μm | iron-based soft magnetic alloy particles | — | — | — | 620 (42) |
| Fe-Cr particles 8 μm | iron-based soft magnetic alloy particles | — | — | — | — |
| Fe-Si particles 300 μm | iron-based soft magnetic alloy particles | — | — | — | — |
| Fe-Si-Al particles 170 μm | iron-based soft magnetic alloy particles | — | — | — | — |
| Imaginary part (μ") of relative permeability | at 18 GHz | 1.0 | 0.9 | 0.7 | 0.7 |
| | at 20 GHz | 1.0 | 0.9 | 0.7 | 0.6 |
| | at 26.5 GHz | 0.7 | 0.6 | 0.6 | 0.4 |
| Thermal conductivity (W/m·K) | | 2.0 | 0.7 | 0.5 | 0.6 |

TABLE 3

| Material | Explanation | Comparative Example 4 | Comparative Example 5 | Comparative Example 6 |
|---|---|---|---|---|
| | | Additive amount (phr), value in parentheses (Vol %) | | |
| Liquid silicone resin I | viscosity 0.4 Pa·s | — | — | — |
| Liquid silicone resin II | viscosity 60 Pa·s | 100 | 100 | 100 |
| Aluminum oxide 62 μm | thermally conductive particles | — | — | — |
| Carbonyl iron particles 4 μm | metal soft magnetic particles | — | — | — |
| Fe-Ni particles 10 μm | iron-based soft magnetic alloy particles | — | — | — |
| Fe-Cr particles 8 μm | iron-based soft magnetic alloy particles | 280 (42) | — | — |
| Fe-Si particles 300 μm | iron-based soft magnetic alloy particles | — | 290 (42) | — |
| Fe-Si-Al particles 170 μm | iron-based soft magnetic alloy particles | — | — | 290 (42) |
| Imaginary part (μ") of relative permeability | at 18 GHz | 0.7 | 0.3 | 0.1 |
| | at 20 GHz | 0.6 | 0.3 | 0.1 |
| | at 25 GHz | 0.4 | 0.2 | 0.1 |
| Thermal conductivity (W/m·K) | | 0.5 | 0.5 | 0.4 |

As can be seen from Tables 1 to 3, the sheets of Examples 1 to 5 had a large value of the imaginary part (μ") of relative permeability in a frequency band of 18 to 26.5 GHz, were able to efficiently absorb electromagnetic wave noise in this frequency band, and also had a high thermal conductivity.

INDUSTRIAL APPLICABILITY

The electromagnetic wave absorbing thermally conductive composition and its sheet of the present invention can address two problems of heat dissipation and electromagnetic wave noise simultaneously, and thus are highly useful for applications, including electronic components such as LEDs and household electrical appliances, information and communication modules including optical communication equipment, and components mounted on vehicles.

DESCRIPTION OF REFERENCE NUMERALS

11 Thermal conductivity measuring apparatus
12 Sensor
13a, 13b Thermally conductive sheet sample
14 Tip of the sensor
15 Electrode for applied current
16 Electrode for resistance value (temperature measurement electrode)

The invention claimed is:

1. An electromagnetic wave absorbing thermally conductive composition comprising:
a matrix resin component;
metal soft magnetic particles; and
thermally conductive particles,
wherein the metal soft magnetic particles are carbonyl iron particles and are present in an amount of 30% by volume or more when the electromagnetic wave absorbing thermally conductive composition is a population parameter,
a value of an imaginary part ($\mu''$) of relative permeability of the electromagnetic wave absorbing thermally conductive composition is 0.9 or more in at least some bands in a frequency range of 18 to 26.5 GHz, and
the electromagnetic wave absorbing thermally conductive composition in the form of a sheet has a thermal conductivity of 2.0 W/m·K or more in a thickness direction.

2. The electromagnetic wave absorbing thermally conductive composition according to claim 1, wherein the value of the imaginary part ($\mu''$) of relative permeability of the electromagnetic wave absorbing thermally conductive composition is 0.9 or more in an entire band in the frequency range of 18 to 26.5 GHz.

3. The electromagnetic wave absorbing thermally conductive composition according to claim 1 or 2, wherein the thermally conductive particles are thermally conductive inorganic particles composed of at least one selected from a metal oxide, a metal nitride, a metal carbide, a metal boride, and a metal simple substance.

4. The electromagnetic wave absorbing thermally conductive composition according to claim 1, wherein the matrix resin component is a thermosetting resin.

5. The electromagnetic wave absorbing thermally conductive composition according to claim 4, wherein the thermosetting resin is a silicone resin.

6. The electromagnetic wave absorbing thermally conductive composition according to claim 5, wherein the silicone resin is a liquid silicone resin having a viscosity of 1.5 Pa·s or less at 25° C. before curing, which is measured by a V-type rotational viscometer (rotor No. 2, number of revolutions: 30 rpm).

7. The electromagnetic wave absorbing thermally conductive composition according to claim 1, wherein at least one selected from the metal soft magnetic particles and the thermally conductive particles are surface treated with a silane compound, a titanate compound, an aluminate compound, or partial hydrolysates thereof.

8. The electromagnetic wave absorbing thermally conductive composition according to claim 1, wherein the thermally conductive particles are present in an amount of 7 to 45% by volume when the electromagnetic wave absorbing thermally conductive composition is a population parameter.

9. The electromagnetic wave absorbing thermally conductive composition according to claim 1, wherein an average particle size of the carbonyl iron particles is 0.1 to 100 μm, and an average particle size of the thermally conductive particles is 0.1 to 100 μm.

10. An electromagnetic wave absorbing thermally conductive sheet comprising an electromagnetic wave absorbing thermally conductive composition in the form of a sheet,
the electromagnetic wave absorbing thermally conductive composition comprising a matrix resin component, metal soft magnetic particles, and thermally conductive particles,
wherein the metal soft magnetic particles are carbonyl iron particles and are present in an amount of 30% by volume or more when the electromagnetic wave absorbing thermally conductive composition is a population parameter,
a value of an imaginary part ($\mu''$) of relative permeability of the electromagnetic wave absorbing thermally conductive sheet is 0.9 or more in at least some bands in a frequency range of 18 to 26.5 GHz, and
the electromagnetic wave absorbing thermally conductive sheet has a thermal conductivity of 2.0 W/m·K or more in a thickness direction.

11. The electromagnetic wave absorbing thermally conductive sheet according to claim 10, wherein the value of the imaginary part ($\mu''$) of relative permeability of the electromagnetic wave absorbing thermally conductive sheet is 0.9 or more in an entire band in the frequency range of 18 to 26.5 GHz.

12. The electromagnetic wave absorbing thermally conductive sheet according to claim 10, wherein the thermally conductive particles are thermally conductive inorganic particles composed of at least one selected from a metal oxide, a metal nitride, a metal carbide, a metal boride, and a metal simple substance.

13. The electromagnetic wave absorbing thermally conductive sheet according to claim 10, wherein the matrix resin component is a thermosetting resin.

14. The electromagnetic wave absorbing thermally conductive sheet according to claim 10, wherein the thermosetting resin is a silicone resin.

15. The electromagnetic wave absorbing thermally conductive sheet according to claim 14, wherein the silicone resin is a liquid silicone resin having a viscosity of 1.5 Pa·s or less at 25° C. before curing, which is measured by a V-type rotational viscometer (rotor No. 2, number of revolutions: 30 rpm).

16. The electromagnetic wave absorbing thermally conductive sheet according to claim 10, wherein at least one selected from the metal soft magnetic particles and the thermally conductive particles are surface treated with a silane compound, a titanate compound, an aluminate compound, or partial hydrolysates thereof.

17. The electromagnetic wave absorbing thermally conductive sheet according to claim 10, wherein the thermally conductive particles are present in an amount of 7 to 45% by volume when the electromagnetic wave absorbing thermally conductive composition is a population parameter.

18. The electromagnetic wave absorbing thermally conductive sheet according to claim 10, wherein an average particle size of the carbonyl iron particles is 0.1 to 100 μm, and an average particle size of the thermally conductive particles is 0.1 to 100 μm.

* * * * *